(12) United States Patent
Kawase

(10) Patent No.: US 6,730,357 B2
(45) Date of Patent: May 4, 2004

(54) DEPOSITION OF SOLUBLE MATERIALS

(75) Inventor: Takeo Kawase, Cambridge (GB)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/979,108

(22) PCT Filed: Mar. 23, 2001

(86) PCT No.: PCT/GB01/01294

§ 371 (c)(1), (2), (4) Date: Dec. 13, 2001

(87) PCT Pub. No.: WO01/70506

PCT Pub. Date: Sep. 27, 2001

(65) Prior Publication Data

US 2002/0186287 A1 Dec. 12, 2002

(30) Foreign Application Priority Data

Mar. 23, 2000 (GB) ................................. 0007086

(51) Int. Cl.⁷ ..................... B05D 1/36; B41J 2/01
(52) U.S. Cl. ............... 427/258; 427/377; 427/384; 347/102; 347/25; 347/77; 313/498
(58) Field of Search ............. 427/258, 377, 427/384; 347/102, 25, 77; 313/498

(56) References Cited

U.S. PATENT DOCUMENTS

| | | | |
|---|---|---|---|
| 3,982,251 A | 9/1976 | Hochberg | 346/1 |
| 4,196,437 A | 4/1980 | Hertz | 346/1.1 |
| 4,891,242 A | 1/1990 | Ito et al. | 427/53.1 |
| 5,132,248 A | 7/1992 | Drummond et al. | 437/173 |
| 5,296,873 A * | 3/1994 | Russell et al. | 346/25 |
| 5,528,271 A | 6/1996 | Ebisawa | 347/34 |
| 5,789,774 A | 8/1998 | Merrill | 257/292 |
| 5,933,164 A | 8/1999 | Sato et al. | 347/43 |
| 6,372,154 B1 * | 4/2002 | Li | 252/301.16 |
| 6,390,618 B1 * | 5/2002 | Wotton et al. | 347/102 |
| 6,515,417 B1 * | 2/2003 | Duggal et al. | 313/506 |

FOREIGN PATENT DOCUMENTS

| | | | |
|---|---|---|---|
| CH | 673 920 A5 | 4/1990 | |
| DE | 35 39 781 A1 | 5/1987 | |
| EP | 0 132 677 A1 | 2/1985 | |
| EP | 0 306 341 A1 | 3/1989 | |
| EP | 0 568 272 A1 | 11/1993 | |
| EP | 0 671 268 A1 | 9/1995 | |
| EP | 0 802 060 A2 | 10/1997 | |
| EP | 0 802 063 A1 | 10/1997 | |
| EP | 0930641 | 7/1999 | |
| FR | 2 602 462 | 2/1988 | |
| FR | 2 718 142 | 10/1995 | |
| GB | 2 273 506 A | 6/1994 | |
| GB | 2 357 996 A | 7/2001 | |
| JP | 54156536 A * | 12/1979 | B41J/3/04 |
| JP | A-2-252566 | 10/1990 | |
| JP | A-5-147204 | 6/1993 | |
| JP | A-6-286162 | 10/1994 | |
| JP | A-10-235280 | 9/1998 | |
| JP | A-11-204529 | 7/1999 | |
| WO | WO 86/01747 | 3/1986 | |
| WO | WO 89/05567 | 6/1989 | |

* cited by examiner

*Primary Examiner*—Elena Tsoy
(74) *Attorney, Agent, or Firm*—Oliff & Berridge, PLC

(57) ABSTRACT

The invention provides a method of depositing a soluble material on a substrate comprising the steps of: loading the soluble material into an ink-jet print head; providing a flow of gas between the ink-jet print head and the substrate or adjacent thereto; and ejecting the material from the print head so as to deposit it on the substrate. Also provided is an apparatus for depositing a soluble material on a substrate, comprising an ink-jet print head and gas flow means for providing a flow of gas between the ink-jet print head and the substrate or adjacent thereto. In a preferred arrangement, heating of the substrate during deposition is also provided. In a most preferred arrangement, the deposition is additionally conducted on the basis of continuous formation of a sequence of partially overlapping dots.

9 Claims, 9 Drawing Sheets

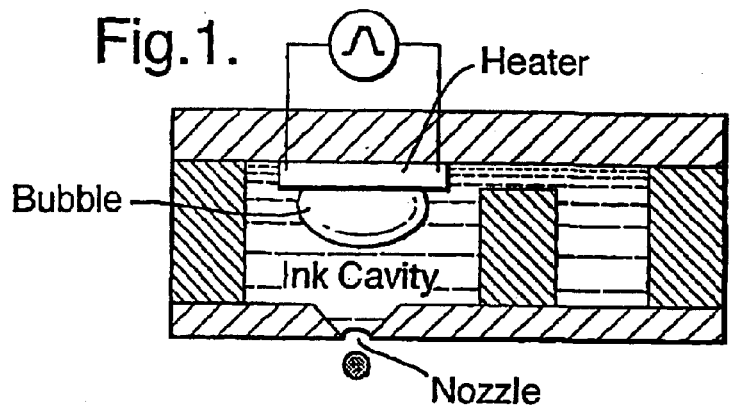
Fig.1.
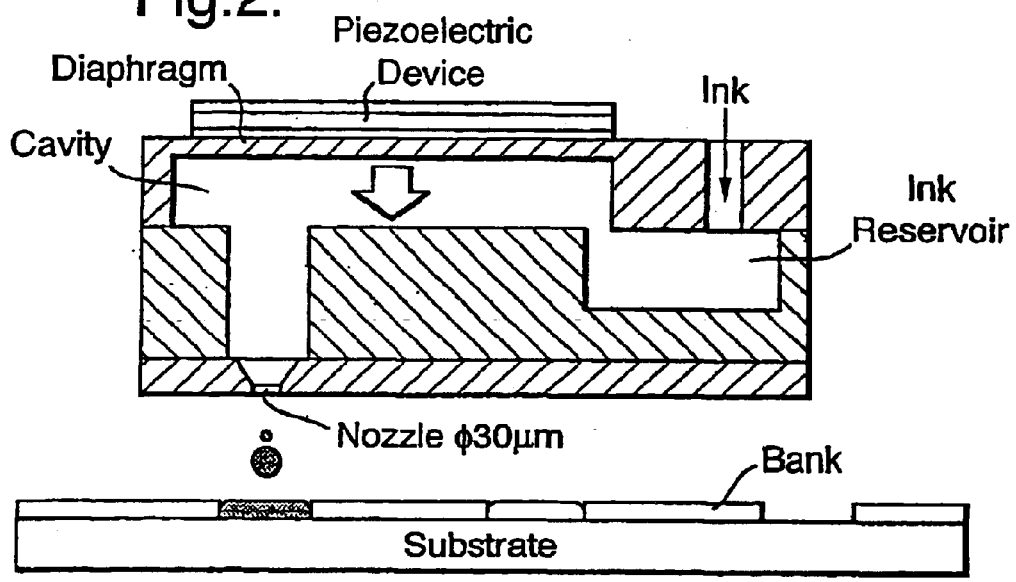
Fig.2.
Fig.3. Spin-coating        Inkjet Deposition
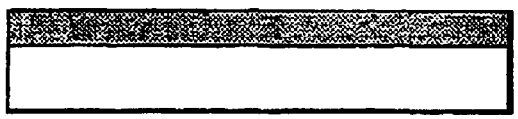
Inhomogeneous Film
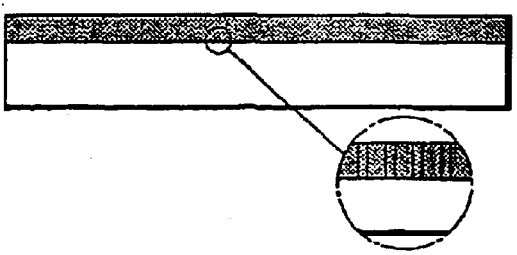
Unusual Phase Separation

Fig.7.
Xylene, On PEDOT
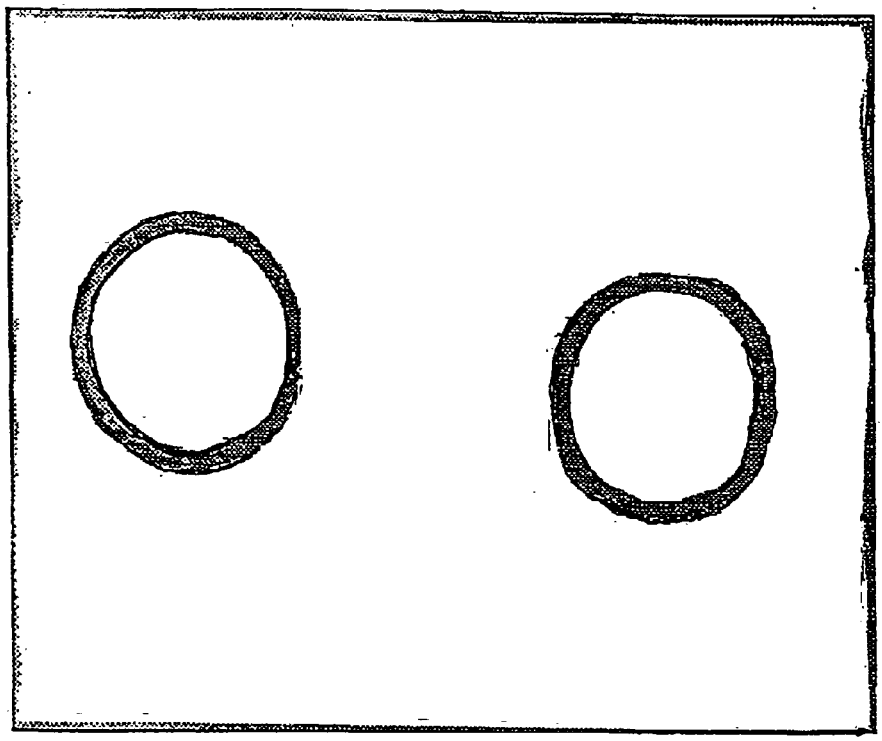
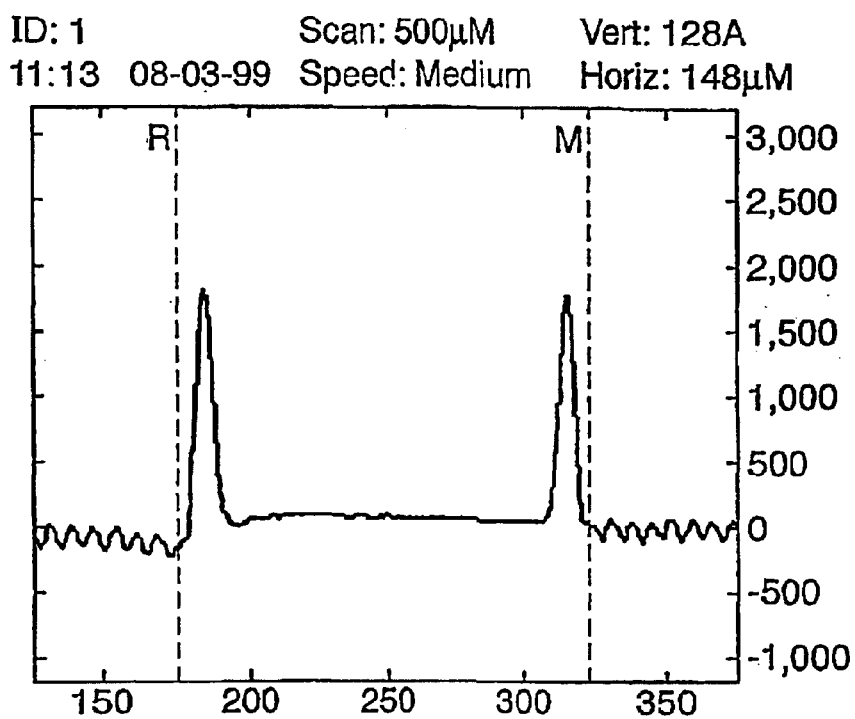

Fig.7(Cont.)i
Cyclohexylbezene, On PEDOT
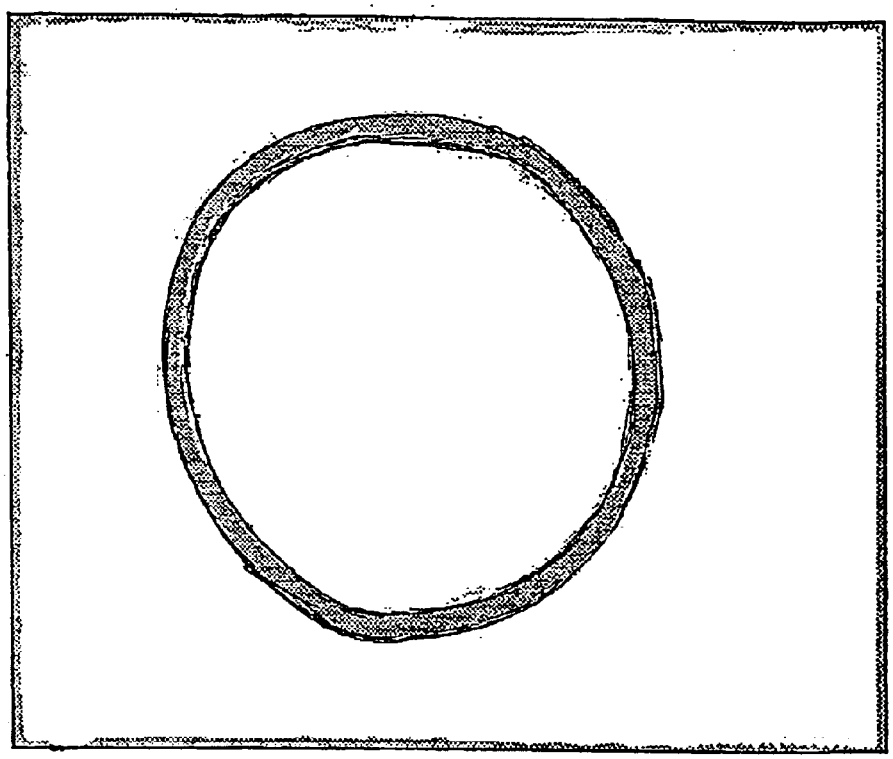
ID: 1          Scan: 700μM      Vert: 23A
22:23  08-03-99   Speed: Medium    Horiz: 302μM
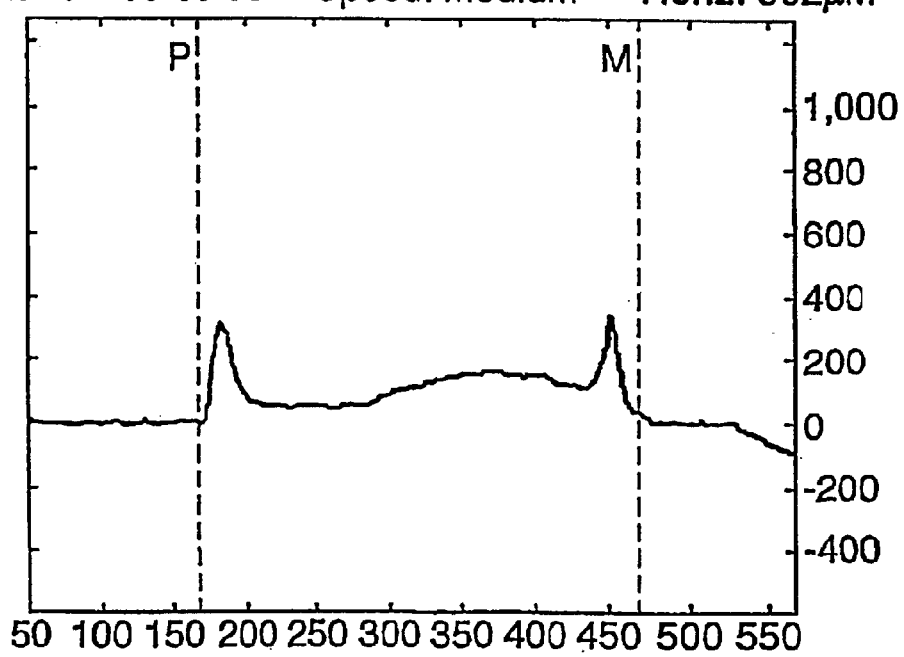
R CUR: 6A    @ 166μM      R Cursor = 166
M CUR: 29A   @ 468μM      Sloan Dektak II

Fig.7(Cont.)ii
Cyclohexlbezene, On Glass
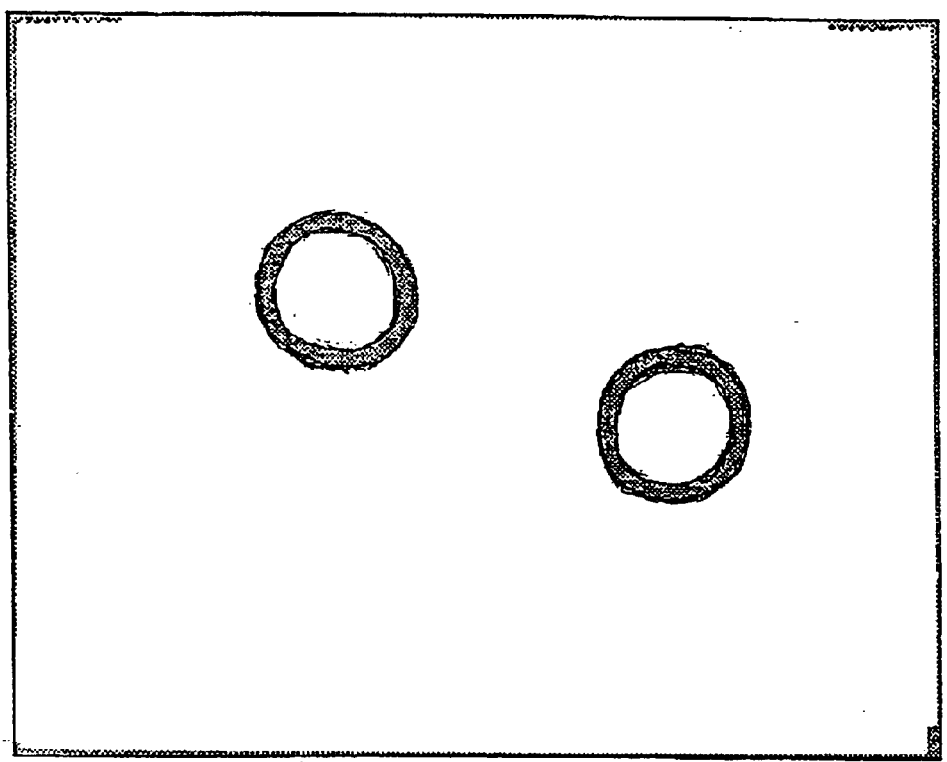
ID: 1  Scan: 700μM  Vert: 21A
22:44  08-03-99  Speed: Medium  Horiz: 110μM
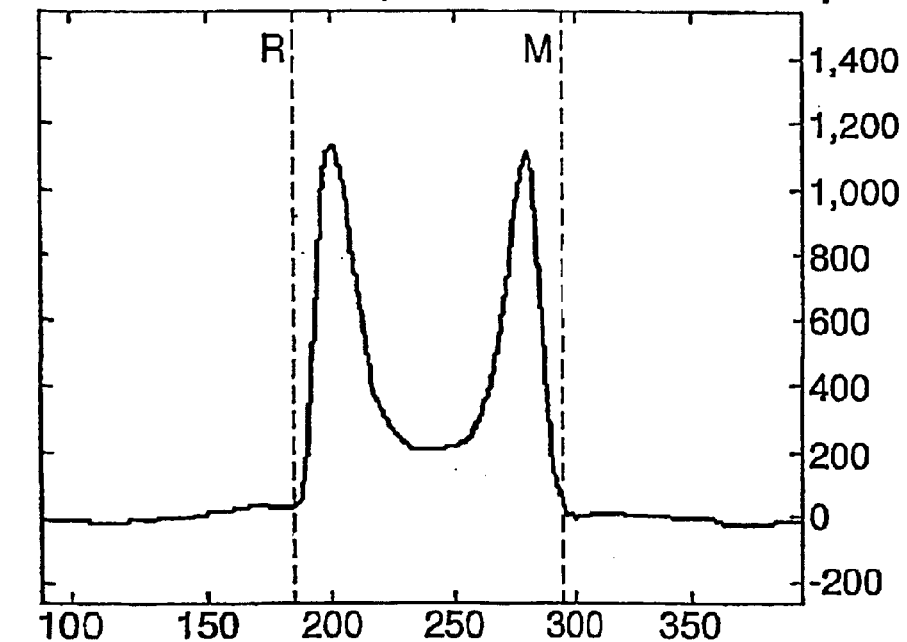
R CUR: 25A  @184mM  M Cursor = 294
M CUR: 45A  @294mM  Sloan Dektak II

Fig.9a.
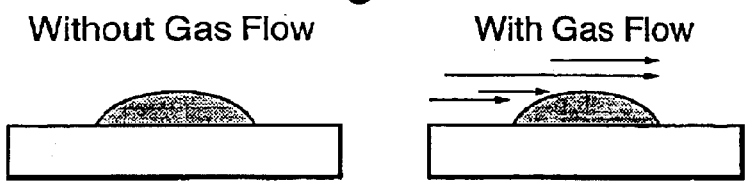
Without Gas Flow      With Gas Flow
Fig.9b.
Fig.10.
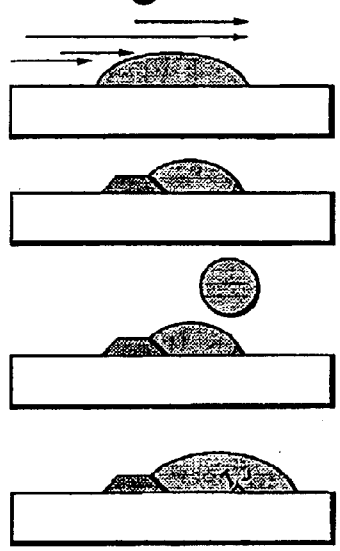
Fig.11.   Continuous Inkjet Deposition
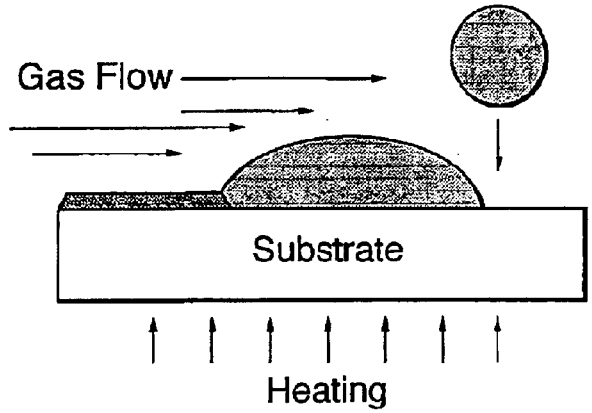

IJ-deposited Area

DEPOSITION OF SOLUBLE MATERIALS

BACKGROUND OF THE INVENTION

1. Field of Invention

The present invention relates generally to the deposition of soluble materials and more particularly to the deposition of soluble materials using ink-jet technology.

2. Description of Related Art

Herein the expression "solid surface" is used to mean the surface of a material which does not exhibit a capillary force. Fibrous materials, including paper, exhibit a capillary force and this is used as an essential part of the process for printing on such materials, such as the printing of inks on paper.

In recent years there has been an increase in the number of products which require, as part of their fabrication process, the deposition of soluble materials such as polymers, dyes, a colloid materials and the like on solid surfaces. One example of these products is an electroluminescent display device. An electroluminescent display device requires the deposition of soluble polymers on to a solid substrate. The substrate may, for example, be formed of glass, plastics or of silicon.

In the manufacture of semiconductor display devices it has been conventional to use photolithographic techniques. However, photo-lithographic techniques are relatively complex, time consuming and costly to implement. In addition, photo-lithographic techniques are not readily suitable for use in the deposition of soluble materials. This has hindered the development of products such as electroluminescent display devices. Consequently, it is proposed to use ink-jet technology to deposit soluble materials, such as depositing polymers in the fabrication of electroluminescent display devices.

Ink-jet technology is, by definition, ideally suited to the deposition of soluble materials. It is a fast and inexpensive technique to use. It instantly provides patterning, in contrast to techniques such as spin coating. However, deposition of soluble materials on solid surfaces using ink-jet technology differs from the conventional use of that technology, to deposit ink on paper, and a number of difficulties are encountered. In particular, the specific properties of the soluble materials it is desired to use often differ significantly from the properties of ink used for conventional printing. Also, as already mentioned, the capillary force inherent in a material such as paper plays a significant part in the ink printing process and this aspect of the process is absent when dealing with deposition on to a solid surface.

When depositing soluble materials on a solid surface one of the main requirements is to achieve a homogeneous layer, especially where the solution to be deposited contains two or more different components. It is also a non-trivial problem to obtain the desired thickness of the deposited layer. Issues such as homogeneousness and layer thickness are not crucial when printing ink on paper but are crucial for the fabrication of devices such as electroluminescent displays, particularly given the desire for uniform light output, uniform electrical characteristics and the spatial limitations often imposed in device fabrication. In device fabrication there is a need to minimise the difference in morphology and properties between parts of the device. Generally, these requirements have not been met prior to the present invention and the use of ink-jet technology for the deposition of soluble materials on solid surfaces has thus not previously been implemented on a practicable basis.

SUMMARY OF INVENTION

According to a first aspect of the present invention there is provided a method of depositing a soluble material on a substrate comprising the steps of: loading the soluble material into an ink-jet print head; providing a flow of gas between the ink-jet print head and the substrate or adjacent thereto; and ejecting the material from the print head so as to deposit it on the substrate.

According to a second aspect of the present invention there is provided an apparatus for depositing a soluble material on a substrate, comprising an ink-jet print head and gas flow means for providing a flow of gas between the ink-jet print head and the substrate or adjacent thereto.

In a preferred arrangement, heating of the substrate during deposition is also provided. In a most preferred arrangement, the deposition is additionally conducted on the basis of continuous formation of a sequence of partially overlapping dots.

BRIEF DESCRIPTION OF THE DRAWINGS

Embodiments of the present invention will now be described by way of further example only and with reference to the accompanying drawings, in which:

FIG. 1 is a diagrammatic illustration of a conventional thermal ink-jet print head;

FIG. 2 is a diagrammatic illustration of ink-jet deposition using a piezoelectric ink-jet print head;

FIG. 3 gives a comparison between conventional ink-jet deposition and spin coating;

FIG. 7 illustrates the phenomenon of ring-shaped deposition;

FIGS. 9a–9b illustrate the effect of the embodiments of the present invention shown in FIGS. 8a–8d;

FIG. 10 illustrates an embodiment of the present invention which uses a partial overlap of sequentially deposited dots of material;

FIG. 11 illustrates a preferred embodiment according to the present invention;

DETAILED DESCRIPTION OF PREFERRED EMBODIMENTS

Figure 4:
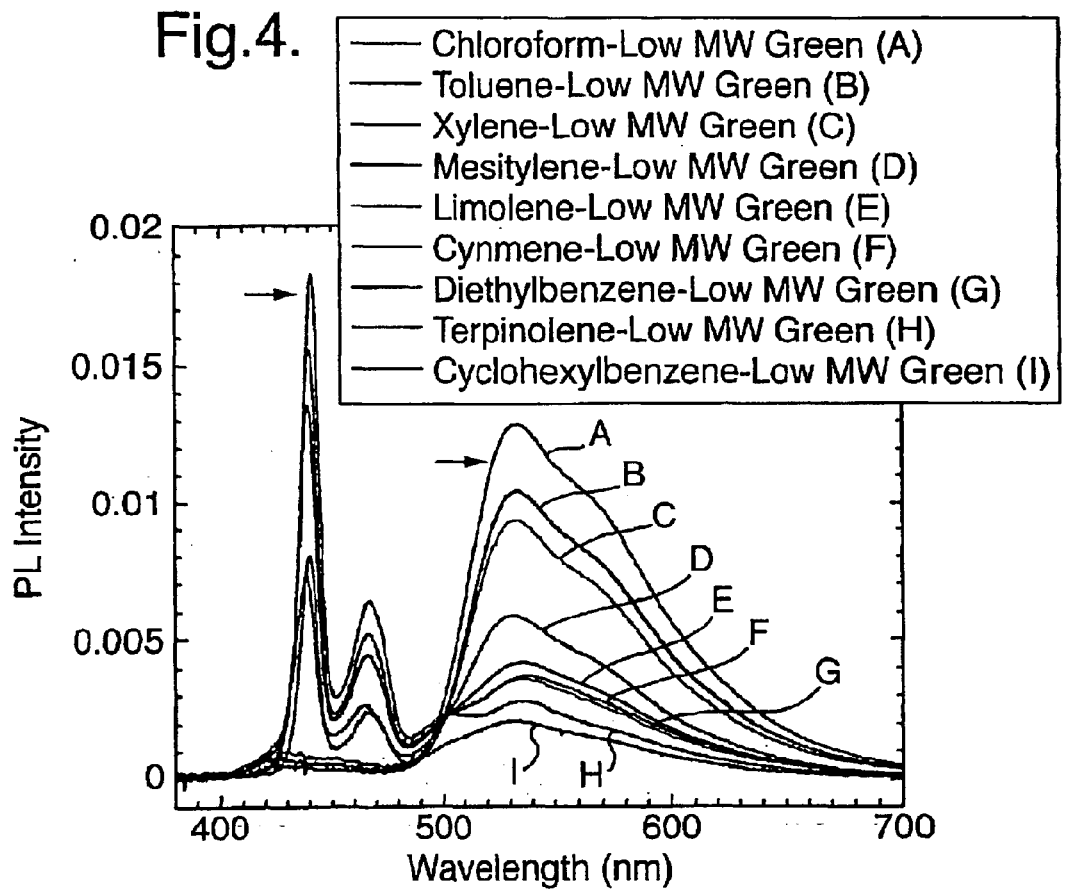
FIG. 4 is a graph of "Photoluminescent (PL) Intensity versus Wavelength", for illustrating the effect of various solvents.

Various aspects of the present invention will now be described with reference to the manufacture of electroluminescent and photoluminescent display devices, particularly to the deposition of the light emitting materials involved therein. In relation to display devices the invention can be used, for example, in the formation of the light emitting areas, formation of electrodes, and/or the formation of colour filters. However, it is to be understood that the techniques described according to the invention are much more generally applicable and are not limited by the reference to display devices.

The present invention is concerned with practicable implementation of ink-jet technology in the deposition of soluble materials. There are two main types of ink-jet techniques, one uses a thermal print head (the so-called "bubble-jet head") and the other uses a piezoelectric print head. The structure and operation of a thermal ink-jet head is illustrated in FIG. 1 and the structure and operation of a piezoelectric head is illustrated in FIG. 2. Some of the properties of the two types of ink-jet techniques are compared in the following table:

|  | Piezo-type | Thermal-type |
| --- | --- | --- |
| Lifetime | 2 billion dots | 0.1 billion dots |
| Ink solvent | Any liquid | Water |
| Heat damage | No | Yes > 200° C. |
| Dot shape | Round | Splashy |

The characteristic of heat damage is included in the comparison made above. As noted, the thermal type print head can cause heat damage to the material being deposited. Potential heat damage to the materials being deposited is a major concern. Normal printing inks, in conventional ink-jet printing, impose relatively few limitations but with the applications envisaged by the present invention the functionality of the deposited material—such as it's insulating properties or it's light emitting properties—is all important. It is necessary to ensure that the functionality of the material is not damaged, eg by too high a temperature, during the deposition process.

FIG. 2 illustrates the use of a piezoelectric ink-jet head to deposit a material on a substrate. In the formation of electroluminescent devices, confinement of the electroluminescent polymer is an important concern. This can be dealt with by using a so-called Bank material to define the areas in which the electroluminescent polymer is to be contained, as illustrated in FIG. 2. The Bank material has a de-wetting surface whereas the "wells" defined by the Bank material have wetting surfaces. Good confinement of the polymer can thus be achieved. However, application of the Bank material is not straight forward. Using ink-jet technology it is possible to draw a pattern on the substrate by controlling the wetting properties of the material applied. The confinement process is thus facilitated.

A significant problem is that of ensuring the quality of the deposited film of material. As mentioned above, homogeneousness and layer thickness are crucial. FIG. 3 illustrates two substantial problems to be overcome in practicable implementation of ink-jet deposition, by comparison of ink-jet deposition with spin coating. As illustrated, ink-jet deposition tends to produce a substantially inhomogeneous film. Further, with ink-jet deposition there is a substantial problem with phase separation of components during, or upon, deposition. In the conventional application by spin coating of a solution mixture (of a solvent and, say, two components) it is found that a very fine phase separation of the two components will often occur. This is at a microscopic level, typically over distances of the order of $10^{-8}$ meters. However, when the solution mixture is applied using ink-jet technology it has been found that the phase separation becomes macroscopic, with large scale domains of each component being formed over distances of the order of $10^{-6}$ meters. This is an unusually strong separation of the deposited components and clearly it is very undesirable in relation to layer homogeneousness.

The practical significance of the phase separation will be demonstrated with reference to the example of fabricating a green photoluminescent display. In such a display a polymer mix is deposited on to a substrate to form a device which is illuminated with ultra-violet radiation to stimulate photoluminescence in the deposited polymer materials. The polymer mix might typically comprise F8/F8BT/TFB, where F8 is [poly(9,9-dioctylfluorene)], F8BT is [poly(9,9-dioctylfluorene-co-2,1,3-benzothiadizole)] and TFB is [poly(9,9-dioctylfluorene-co-N-(4-butylphenyl)diphenylamine)]. The emissively active components of the mix are the F8 and the F8BT materials. The F8 material by itself will give a blue output with a wavelength of approximately 420–450 nm and the F8BT material by itself win give a green output with a wavelength of approximately 550 nm. It is found that there is an energy transfer between the F8 material and the F8BT material, so that in a good mix of the polymers it is found that only a green output results from the photoluminescence. The energy transfer occurs only at the domain interface between the F8 and the F8BT materials and does not occur in the bulk materials. When the mix is applied by spin coating, the phase separation occurs over distances of nanometers and the energy transfer is fully effective so that only a green output is obtained. However, when the mix is applied by ink-jet deposition, the phase separation occurs over distances of micrometers and the energy transfer is not effective so that separate blue and green outputs are seen. This example of the phase separation problem is useful since it can also be applied to demonstrate the effects of different solvents.

The question of heat damage to the materials being deposited has been mentioned above. It is also necessary to note that the thermal print head is not suitable for use with the high boiling point organic solvents, which materials are often of interest in the deposition of soluble materials on to a solid surface. It is desirable to use high boiling point solvents in the ink-jet deposition process because such materials substantially reduce the risk of blocking of the nozzles of the ink-jet head. This is a particularly important consideration because the functional materials which it is here desired to deposit have much larger molecular structures than the dyes used in conventional ink-jet printing. However, the choice of materials must be optimised for their desired function when deposited and the issue of reduced tendency to cause blocking of the ink-jet nozzles has therefore to be considered as secondary. As a result more attention has to be given to the choice of solvent used. Conventional solvents such as chloroform readily form a deposit around the ink-jet nozzles and such deposits can rapidly result in deterioration of ink-jet performance, for example by causing a deflection of the ejected material from the intended direction. As a consequence there is a strong desire to use high boiling point solvents so as to avoid these problems. However, the high boiling point solvents tend to produce non-uniformities in the deposited film.

The solvent problem will be discussed further with reference back to the photoluminescent polymer mix described above. In this respect, the following is a list of solvents which can potentially be used with the polymer mix to provide a material for ink-jet deposition; for each solvent certain relevant characteristics are given {Boiling point (BP), Melting point (MP), Surface tension (ST)}:

|  | BP (° C.) | MP (° C.) | ST (mN/m) |
|---|---|---|---|
| Chloroform | 61 | −63 | 27.1 (20° C.) |
| Toluene | 111 | −95 | 27.9 (20° C.) |
| p-Xylene | 138 | 13 | 27.7 (20° C.) |
| Mesitylene | 165 | −45 | 28.3 (20° C.) |
| Limoneene | 177 | −97 |  |
| p-Cymene | 177 | −73 |  |
| Diethylbenzene | 182 | −42 | 29.0 (20° C.) |
| Terpinolene | 184 |  |  |
| Dimethylimidazolidinone (DMI) | 226 | 8 | 41.0 (20° C.) |
| Cyclohexylbenzene | 239 | 7 |  |
| Dodecylbenzene | 331 |  |  |

Figure 5:
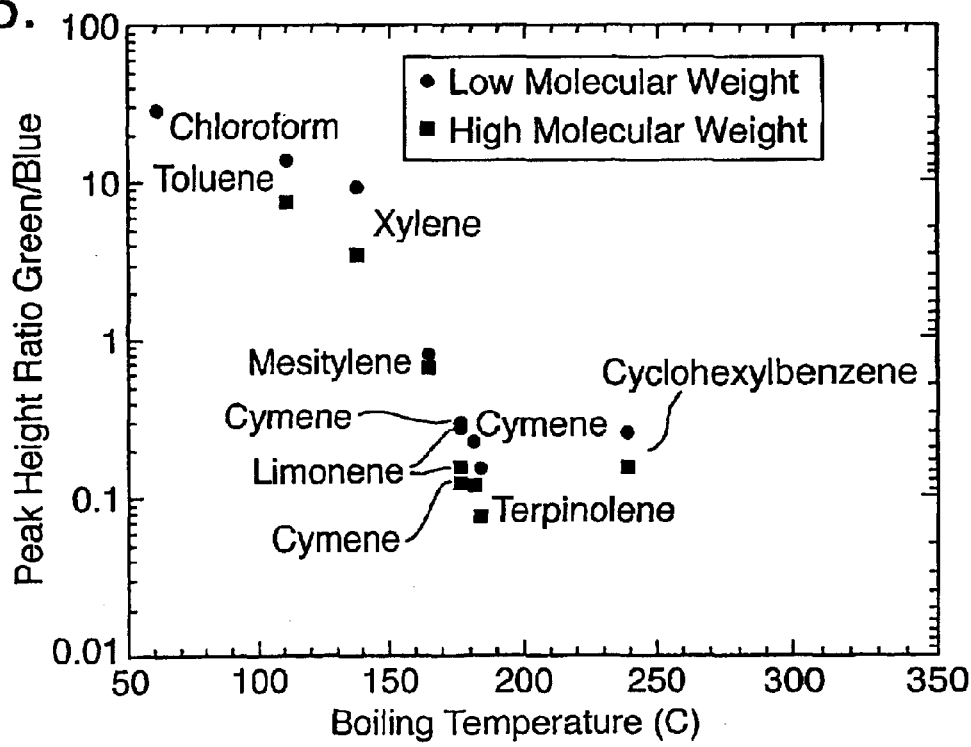
FIG. 5 is a plot of "Peak Height Ratio (Green/Blue) versus Boiling Point" for low and high molecular weight versions of various solvents.

FIG. 4 is a graph showing Photoluminescent (PL) Intensity versus Wavelength and illustrating the effect of substituting various of the above solvents with the F8/F8BT/TFB mix for deposition. FIG. 5 is a plot of Peak Height Ratio (Green/Blue) versus Boiling Point using low and high molecular weight versions of various of the solvents with the F8/F8BT/TFB mix. FIG. 4 demonstrates that the choice of solvent has a significant effect upon photoluminescent intensity of the deposited material. FIG. 5 demonstrates that phase separation of the polymers is worst with high boiling point solvents. As noted above, the low boiling point solvents do not give good stability of ejection of the material for deposit.

Figure 6:
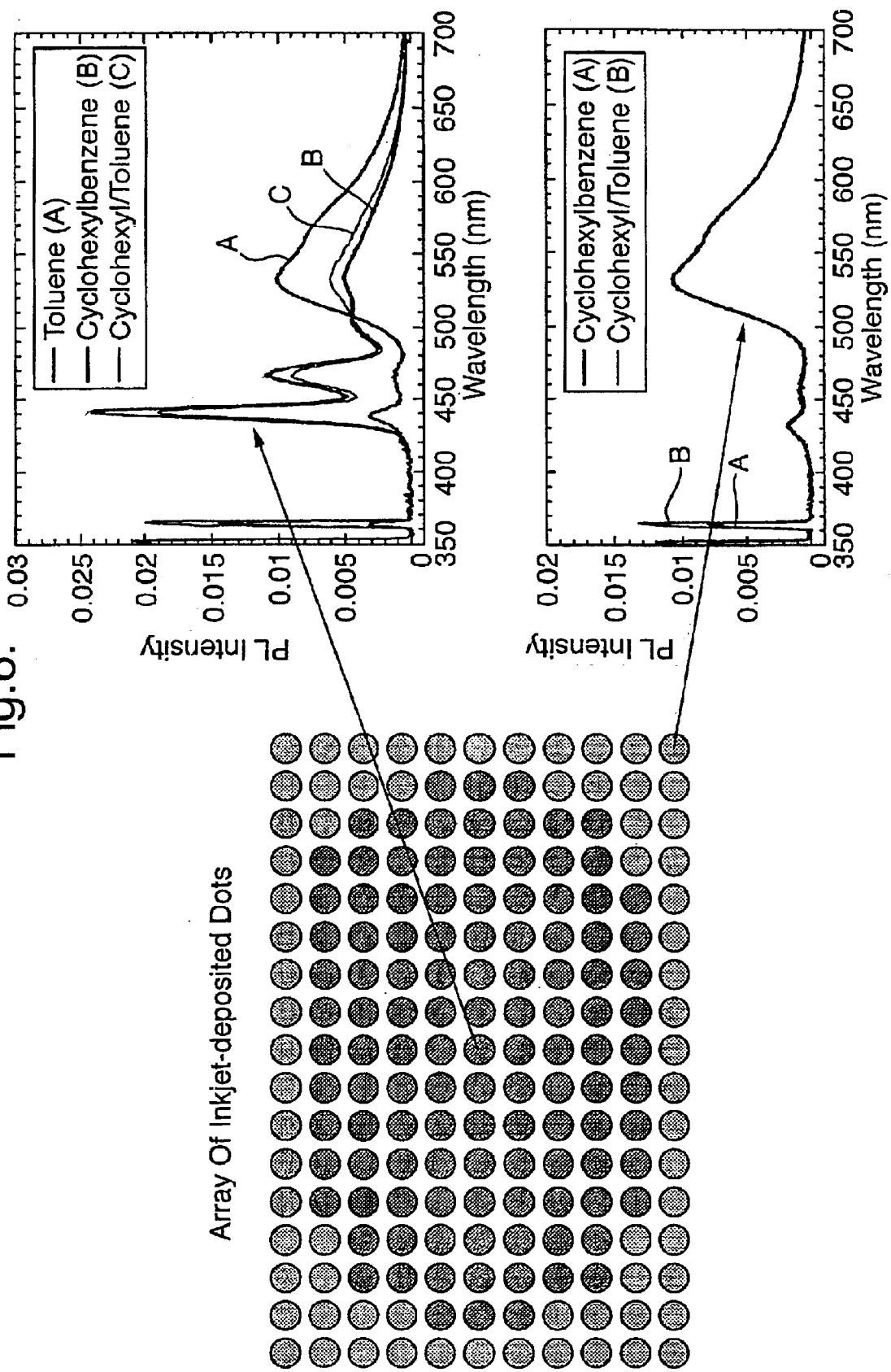
FIG. 6 shows an array of ink-jet deposited dots of photoluminescent material and illustrates problems associated therewith.
Figure 8A:
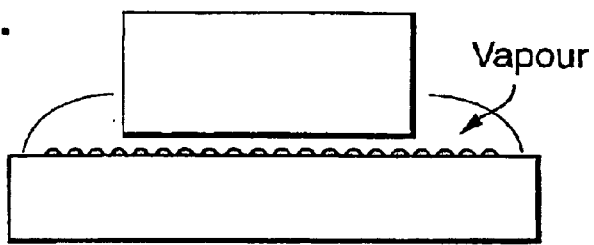
FIGS. 8a–8d depict various arrangements embodying the present invention and other arrangements useful in the explanation of the embodiments.
Figure 8B:
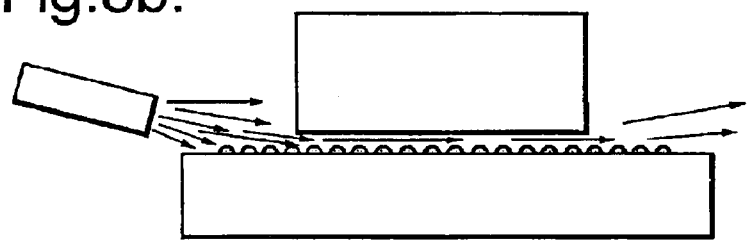
Figure 8C:
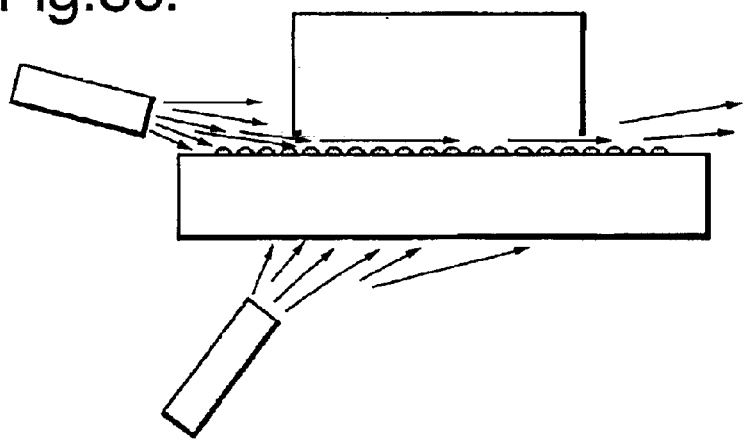
Figure 8D:
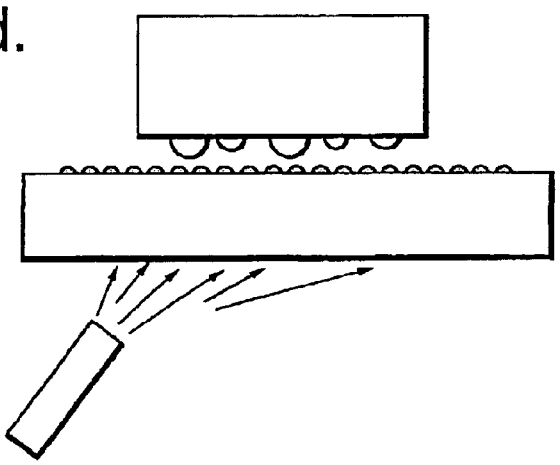

Another difficulty is that ink-jet deposition seems to encourage nucleation. Even with single component inks in conventional ink-jet printing there is a tendency for the growth of a nucleus in the deposited ink. This nucleation is found to be dependent upon the drying speed of the deposited material. It causes a severe practical difficulty in implementing a matrix display formed of ink-jet deposited dots of photoluminescent material. This difficulty can be seen from FIG. 6. FIG. 6 shows an array of ink-jet deposited dots of photoluminescent material. The dots around the edge of the array (shaded grey in FIG. 6) dry more quickly than those in the centre of the array (shaded black in FIG. 6). Nucleation occurs to a greater extent in the slower drying dots. Nucleation aggravates the phase separation problem and results in a difference in spectral output between those dots at the edge of the array and those in the center of the array. This effect is shown by the PL Intensity-v-Wavelength graphs included in FIG. 6. The highly undesirable nature of this effect for a practicable matrix display is obvious.

The discussion given above has been concerned primarily with the difficulties relating to the formation of a homogeneous layer of deposited material. The other main concern is achieving the desired thickness for the layer of deposited material. In this respect the phenomenon of ring-shaped deposition is found to occur when using ink-jet technology to deposit soluble materials on a solid surface. FIG. 7 illustrates the phenomenon, with three examples. The first two examples show deposits of F8 on to a layer of PEDOT (Poly-3,4-EthleneDiOxyThiophene), with different solvents (xylene and cyclohexylbenzene) being used in the solution deposited. The third example shows cyclohexylbenzene as the solvent and glass as the substrate. Generally, the choice of material for the substrate is largely irrelevant, but it is here shown to have an effect.

It is found that the phenomenon of ring-shaped deposition can not be overcome simply by repeated deposition to increase the thickness of the deposited material. Such action is found to increase the height of the nucleated ring and not to in fill the centre of the ring.

At first it might be thought that the ring-shaped deposit phenomenon might be associated with the nozzles of the ink-jet head, but this is found not to be the case. Instead it has been found that the phenomenon is the result of drying characteristics of the deposited material. It is believed that this is the result of a graduation of vapour concentration across the dot of deposited material. The low surface tension of organic solvents makes this problem worse. Specifically, the edge of the dot dries quickly and thus "pins" the edge of the dot to the surface of the substrate. At the centre of the dot there is a high vapour concentration (of solvent/mix) which inhibits drying. Thus an internal flow of material to the nucleated outer ring becomes established. As a consequence the nucleated ring-shape continues to grow until all of the material has dried. The effect is illustrated in the respective cross-sectional scan shown below each of the examples in FIG. 7. This problem occurs even when material is deposited onto a substrate provide with a Bank pattern. That is, rather than filling the Bank pattern to a uniform level, the deposited material adheres to the walls of the Bank which acts in the same way as the above described nucleation edge and the central area is left with, at best, a thin coating of deposited material. The problem is very server and typically the amount of material at the centre is less than 17% (perhaps even only 10%) of that at the nucleation edge [this can be referred to as the effective polymer ratio]. That is, it is the material at the centre which acts as the active material in the finished device and material adhered to the walls is effectively wasted. In addition to avoiding the very high percentage of waste, if the effective polymer ratio can be increased then it becomes possible to use a more dilute solution which in turn results in a more stable ejection of droplets from the nozzles of the head.

The above described problems can be ameliorated or avoided by the present invention which provides for an increase in the drying speed of the deposited material. The invention provides a flow of gas between the ink-jet head and the substrate (or adjacent thereto) on to which material is being deposited from the head. Remarkably, it has been found that this simple solution can overcome the above described problems such as macroscopic domain separation and that the other difficulties conventionally experienced can be overcome. Normally it would be considered that any potential perturbation of the ink-jet ejection process should be avoided, particularly in relation to actual ejection of material and it's travel to the surface on which it is deposited. It might be thought that the trajectory of the ejected material could easily be affected by providing a flow of gas between the head and the surface on which the material is deposited. It might also be thought that the provision of a flow of gas might tend to evaporate the solvents so as to result in clogging of the nozzles of the head (this being a common problem in ink-jet printing). Thus, the present invention provides a method and apparatus which are contrary to the natural inclination of the person skilled in the art. In fact it has been found that the ink-jet process is far less sensitive to perturbations of the type discussed than might be assumed. Of course, taking matters to an extreme it is possible to establish the discussed perturbations but it is found that there has to be an almost deliberate attempt to achieve such a result before undesirable perturbations occur.

Preferably an inert gas such as nitrogen or argon is used in the gas flow provided by the invention. In most cases it will probably be desirable to avoid oxidation but the gas to be used can be chosen in accordance with the characteristics of the material being deposited.

In a preferred embodiment the invention is implemented by a combination of providing a flow of gas between the ink-jet head and the substrate and by heating the substrate during the deposition of material from the ink-jet head. Here again the concepts of the present invention are contrary to conventional thinking in that the application of heat would be considered very undesirable due to the risk of clogging of the head by rapid evaporation of solvents in the ejected material. In fact, the results of the present invention in this preferred embodiment are completely contrary to what would conventionally be expected to happen. Conventionally, heating would be expected to result in clogging of the head. However, heating of the substrate actually causes vapour to be driven off of the deposited material back towards the head. The effect is found to be sufficiently strong that rather than the expected clogging, due to lack of solvent at the ejection nozzles (through increased evaporation), solvent from the deposited material condenses on the head to such an extent that it can interfere with the ejection process. Clearly, the described circumstances depend upon the saturated vapour pressure of the gas and the temperature of the head. Nonetheless, it is remarkable that instead of experiencing the expected clogging of the head one instead sees condensation of solvent on the head. The problem caused by this condensation is, however, avoided by the flow of gas provide by the invention. Thus, heating of the substrate during the deposition of material from the ink-jet head, without the use of a gas flow between the ink-jet head and the substrate will often not produce a satisfactory result. This implies that the temperature of the head should be kept lower than that of the substrate in order to prevent the nozzles from drying.

In accordance with the above, the use of a gas flow without heating of the substrate will often prove to be satisfactory for soluble materials which include mid-boiling point solvents. When high boiling point solvents are used it is likely to be necessary to use substrate heating in addition to the gas flow in order to obtain satisfactory results. However, heating the substrate such that it's temperature is greater than that of the head means that good results can be achieved when using low boiling point solvents.

FIG. 8 illustrates the provision of a gas flow between the ink-jet head and the substrate. FIG. 8a illustrates deposition without the provision of a gas flow. In this case there is an atmosphere of vapour (solvent/mix) around and between the head and the substrate, as indicated in the drawing. The dimensions of the head are large compared to the head/substrate separation. The head thus has a capping effect and the vapour atmosphere is most dense and most persistent directly between the head and the substrate. Due to the capping effect of the head, the presence of this dense vapour atmosphere is not significantly affected by movement of the head during the deposition process. In FIG. 8b it is shown that this vapour atmosphere is removed by the flow of gas, ie the atmosphere around and between the head and the substrate is refreshed. Rapid and uniform drying of the deposited material is achieved using the arrangement shown in FIG. 8b. The preferred embodiment using both a gas flow and heating of the substrate is illustrated in FIG. 8c. As shown in FIG. 8c, the substrate is heated by blowing hot air on to the underside thereof. Other arrangements are possible, for example a hot plate can be used to heat the substrate. FIG. 8d illustrates the problem of solvent condensation on the nozzle plate of the head if heating of the substrate is provided without the use of a gas flow between the ink-jet head and the substrate.

Described above is the preferred arrangement in which a flow of gas is provided between the head and the substrate. The solvent evaporates and is dispersed by diffusion. This diffusion is severely hindered by the capping effect of the head. Thus, although it is preferred that the flow of gas be provided between the head and the substrate, in some circumstances it may be sufficient to provide the flow of gas adjacent to the head/substrate separation rather than actually between the head and the substrate.

As mentioned above, the material of the substrate will often be transparent. Alignment of material deposition with a preformed Bank can thus be viewed from the underside of the substrate. In these circumstances, the use of a hot gas to heat the substrate is preferred because viewing through the substrate is not blocked. The use of a hot plate to heat the substrate would block such viewing. Also the use of a hot gas is preferred because it has been found easier to control the heat input to the substrate. The use of a hot plate can impart too high a temperature to the substrate, and thence to the head; resulting in clogging of the nozzles. Similarly, it is preferred that the hot gas is applied to the underside of the substrate and that directing the hot gas to the top surface of the substrate (for example, in combining the gas flow and the gas heating) will often produce a less beneficial result.

The effect of providing a gas flow between the ink-jet head and the substrate is illustrated in the cross-sectional views of FIG. 9, which compares the situations achieved with and without the provision of a gas flow. FIG. 9a shows the dot of material when first deposited and FIG. 9b shows the deposited material when dry. In plan view the deposited material when dry will be ring-shaped (as explained above) when no gas flow is provided. When a gas flow is provided the ring-shape nucleation and growth is found to be promoted on the side from which the gas flow is directed and diminished from the opposite side. In practice it is found that the height and lateral extent of the ring on the side opposite to the direction of gas flow are both substantially reduced. On the side from which the gas flow is directed, the lateral extent is significantly increased (in the direction following the gas flow) whereas the height tends not to increase. The result is, in plan view, a crescent of dry material on the side from which the gas flow is directed with the remainder of the ring having a very much reduced height and lateral thickness compared with the result when no gas flow is provided. The crescent shape is very beneficial, as will be explained, and the top surface of the crescent is found to be substantially planar, in stark contrast to the profile of the ring deposited when no gas flow is provided.

In a preferred embodiment of the present invention the crescent shaped deposit described above is used to provide an extended layer of deposited material of uniform thickness. Here the substantially planar top surface of the crescent of deposited material is used to particularly beneficial effect. Explained briefly, in this embodiment sequentially deposited dots are arranged partially to overlap each other. The crescent is grown in the lateral direction following the gas flow and the reduced size remainder of the ring is covered by the subsequent deposition. Sequential dots are best deposited before the preceding dot has dried fully, as indicated in the sequence of drawings of FIG. 10. As shown in FIG. 10, subsequently deposited dots in-fill the space between the crescent and the reduced size remainder of the ring of the preceding dot. If the subsequent dot is deposited before the preceding dot has dried, the reduced size remainder of the preceding ring can be re-dissolved by and absorbed in to the subsequent dot. Growth of the crescent in the lateral direction following the gas flow forms a uniform layer of deposited material. The concept of this embodiment can be extended to provide for the continuous deposition of material by the ink-jet head. FIG. 11 illustrates the most preferred arrangement, in which a gas flow is provided, the substrate is heated and the material is deposited continuously.

If one uses conventional ink-jet techniques to try to deposit stripes of material (using the conventional method of in-filling a pattern of Bank material), the above described problem of nucleation on the Bank walls is experienced and a uniform thickness can not be obtained. A satisfactory aperture ratio can not be obtained. The problem is aggravated by the need for a two dimensional Bank structure and that this tends to have round shaped corners. Also a difficulty arises as a result of the surface tension of the deposited material. Surface tension tends to deform the shape of the deposit. That is, surface tension acts to minimise surface area, resulting in a group of droplets rather than an intended stripe. This problem is particularly pronounced when high boiling point solvents are used.

With the embodiment of FIG. 11 it is possible to obtain a stripe-patterned film having a good thickness profile. Such a stripe-patterned film is particularly useful in the fabrication of a full colour display device. According to the present invention, the surface tension induced deformation problems are mitigated, since the gas flow interferes with the surface tension effect and the deposited material dries quickly.

Figure 12:
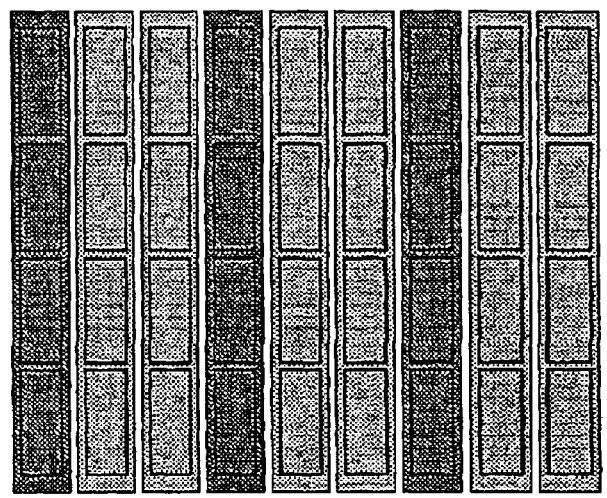
FIG. 12 depicts the fabrication of a fill colour display device using the embodiment of FIG. 11.
Figure 13:
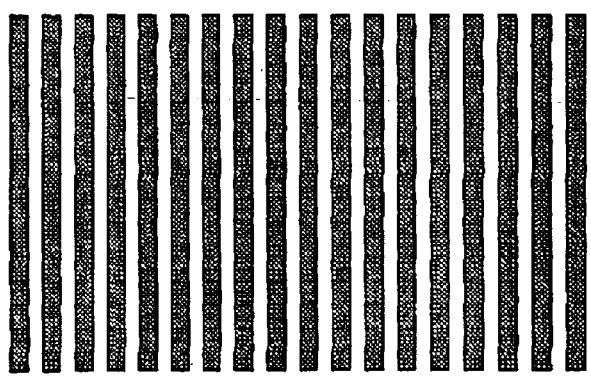
FIG. 13 illustrates the patterning of conductive electrodes for the display device of FIG. 12, using the embodiment of FIG. 11.

The use of stripe-patterned films to provide a full colour display is illustrated in FIG. 12. As indicated in FIG. 12 by shading, and as will be readily apparent, consecutive stripes are formed with deposited materials having light emitting characteristics of different wavelength—for example such that a repeating sequence of red, green and blue light emitting stripes are provided. The embodiment of FIG. 11 can also be used to deposit a conductive conjugated polymer material instead of the light emitting materials discussed above. Patterning of conductive electrodes for the display device can thus be achieved. This is illustrated in FIG. 13. The arrangement of the electrodes can be used operatively to separate deposited stripes of light emitting material in to individual pixels. The conjugated polymer may, for example be formed of PEDOT, polyaniline, polypyrrole or a colloid of metal (Au, Ag etc).

Figure 14:
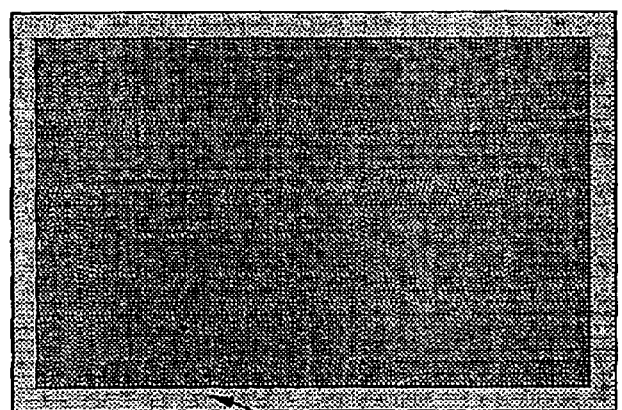
FIG. 14 illustrates a method of avoiding the practical effects of start and finish regions of material deposition in a display device.

When depositing the stripe-patterned film of FIGS. 12 and 13 using the embodiment of FIG. 11 it has been found that there is tendency for the start of each stripe to have a slightly smaller thickness than the body of the stripe and for the end of each stripe to have a slightly larger thickness than the body of the stripe. These features correspond to the start and finish of the continuous deposition process. The potential effects of these thicker and thinner portions of the deposited stripes can be avoided by depositing an area larger than that of the intended, or active, device. This is illustrated in FIG. 14. In FIG. 14 the dark central area is the final display area and the lighter coloured boarder indicates the full extent of the material actually deposited.

The gas flow between the head and the substrate can be provided from a simple nozzle. It is preferred, however, that the gas flow is "laminar" by which is meant preferably not a point source but a source which is at least as broad as a deposited stripe or more preferably as broad as the entire substrate. If a nozzle in the form of an extended slit as wide as the substrate is used then it may be possible for the nozzle to be stationary with respect to the substrate. An alternative, particularly for a less broad nozzle, is for the gas flow nozzle to be mounted so as to move with the head. Most preferably the gas flow is provided in the same direction as the direction of movement of the head. In some cases it might be acceptable to have the gas flow in the opposite direction. Generally, a gas flow in a direction transverse to the direction of movement of the head is likely to result in asymmetrical drying across the width of a deposited stripe although such a gas flow direction might be appropriate in some circumstances.

The foregoing description has been given by way of example only and it will be appreciated by a person skilled in the art that modifications can be made without departing from the scope of the present invention.

What is claimed is:

1. A method of depositing a soluble material on a substrate, said substrate having a non-capillary surface, comprising the steps of:

loading the soluble material into an ink-jet print head;

providing a flow of gas between the ink-jet print head and the substrate;

ejecting the material from the print head so as to deposit it on the non-capillary surface; and heating the substrate during deposition of the material from the underside of the substrate opposite the non-capillary surface, wherein the print head is moved in a specified direction during or between depositions of the soluble material and wherein the step of providing a flow of gas comprises providing the gas flow between the head and the substrate in the said specified direction.

2. The method as claimed in claim 1, wherein the step of heating the substrate includes the application of a hot gas to the substrate.

3. The method as claimed in claim 1, wherein the step of heating the substrate includes the application of a hot plate to the substrate.

4. The method as claimed in claim 1, comprising the steps of ejecting a first dot of material on to the substrate and subsequently ejecting a second dot of material on to the substrate so as partially to overlap the first dot of material.

5. The method as claimed in claim 1, wherein the ejection of dots of material occurs in a continuous manner so as to deposit a continuous stripe of material.

6. A method of manufacturing a device having an active area comprising the step of using the method of claim 1 to deposit material on an area of the substrate larger than the active area.

7. A method of manufacturing a display device including the fabrication of light emitting elements using the method of claim 1.

8. The method as claimed in claim 1, further comprising the step of selecting the soluble material to comprise at least one of [poly(9,9-dioctylfluorene)], [poly(9,9-dioctylfluorene-co-2,1,3-benzothiadizole)] and [poly(9-dioctylfluorene-co-N-(4-butylphenyl)diphenylamine)].

9. The method as claimed in claim 1, further comprising the step of selecting the soluble material to comprise at least one of Chloroform, Toluene, p-Xylene, Mesitylene, Limoneene, p-Cymene, Diethylbenzene, Terpinolene, Dimethylimidazolidinone (DMI), Cyclohexylbenzene, and Dodecylbenzene.

* * * * *

UNITED STATES PATENT AND TRADEMARK OFFICE
CERTIFICATE OF CORRECTION

PATENT NO.    : 6,730,357 B2
DATED         : May 4, 2004
INVENTOR(S)   : Takeo Kawase It is certified that error appears in the above-identified patent and that said Letters Patent is hereby corrected as shown below:

Title page,
Item [73], Assignee, "Seiko Epson Corporation, Tokyo (JP)", please replace with the following:
-- Seiko Epson Corporation, Tokyo (JP) and Cambridge University Technical Services Limited Of The Old Schools, Cambridge, (GB) --.

Signed and Sealed this

Twenty-first Day of December, 2004

JON W. DUDAS
*Director of the United States Patent and Trademark Office*